United States Patent
Yun et al.

(10) Patent No.: US 6,265,139 B1
(45) Date of Patent: Jul. 24, 2001

(54) METHOD FOR FABRICATING PIEZOELECTRIC/ELECTROSTRICTIVE CERAMIC MICRO ACTUATOR USING PHOTOLITHOGRAPHY

(75) Inventors: Sang Kyeong Yun; Sung-June Park, both of Suwon; Yeon Kyoung Jung, Seoul, all of (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/334,127

(22) Filed: Jun. 15, 1999

(30) Foreign Application Priority Data

Dec. 30, 1998 (KR) .................................. 98-60643

(51) Int. Cl.⁷ ........................ B81C 1/00; C04B 35/495; H01L 41/22; H01L 41/24
(52) U.S. Cl. ........................ 430/330; 430/315; 430/319; 430/329
(58) Field of Search .................................. 430/315, 318, 430/324, 330, 329

(56) References Cited

U.S. PATENT DOCUMENTS

| | | | |
|---|---|---|---|
| 5,089,739 | * | 2/1992 | Takahashi et al. .................... 310/328 |
| 5,424,769 | * | 6/1995 | Sakai et al. .............................. 347/70 |
| 5,502,472 | * | 3/1996 | Suzuki .................................... 347/69 |
| 6,029,349 | * | 2/2000 | Berkout et al. ...................... 29/890.1 |
| 6,097,133 | * | 8/2000 | Shimada et al. ...................... 310/358 |
| 6,107,726 | * | 8/2000 | Near et al. ............................ 310/328 |

FOREIGN PATENT DOCUMENTS 10-226069 * 8/1998 (JP) .

OTHER PUBLICATIONS

Chakrbarti et al. "Chemical synthesis of PZT powder by auto–combustion of citrate–nitrate gel.", Mater. Lett., vo91 30(2,3) pp. 169–173, 1997.*
Zhuang et al., "Pyrolysis of PLZT citrate precursor". Wuji Cailiao Xuebao, vol. 3(1) pp. 27–31, 1988 (Abstract only).*
Zhang, et al., "Pyrolysis of PLZT citrate precusor", Wuji Cailiao Xuebao, vol. 3(1) pp. 27–31, 1988.*

* cited by examiner

Primary Examiner—Martin Angebranndt
(74) Attorney, Agent, or Firm—Darby & Darby

(57) ABSTRACT

Disclosed is a method for fabricating a piezoelectric/electrostrictive thick film, using photolithography. On a vibrating plate is formed a bottom electrode. Over the bottom electrode, a photoresist is coated, exposed to light and developed to form molds in fine patterns. Separately, a ceramic paste is prepared by mixing a ceramic oxide powder and a ceramic sol solution. The ceramic oxide powder has a particle size of 5 $\mu$m or less and is prepared from Pb and Ti-based ceramic oxide powder by a non-explosive oxidation-reduction combustion reaction at 100–500° C. while the ceramic sol solution, identical or similar in composition to the ceramic oxide powder, uses water or an organic solvent as an base. Next, the ceramic paste is filled in the molds to form a piezoelectric/electrostrictive film, followed by conducting a thermal treatment at 100 to 300° C. to sinter the film. Finally, a top electrode is formed on the film. Alternatively, the bottom electrode may be not formed if the vibrating plate is of electroconductivity. In the micro actuator, a high aspect ratio of fine patterns and a significant improvement in the bonding properties between the film and the infrastructure are achieved. Also, the film is protected from external damage, such as scratching, because the molds surround the film.

31 Claims, 3 Drawing Sheets

METHOD FOR FABRICATING PIEZOELECTRIC/ELECTROSTRICTIVE CERAMIC MICRO ACTUATOR USING PHOTOLITHOGRAPHY

BACKGROUND OF THE INVENTION

1. Field of the Invention

The present invention relates, in general, to a method for fabricating a micro actuator using photolithography and, more particularly, to an improvement in the aspect ratio of piezoelectric/electrostrictive patterns and in their bonding properties to a substrate, along with the method.

2. Description of the Prior Art

Generally, a micro actuator has a stacked structure in which a vibrating plate underlays a piezoelectric/electrostrictive film with two electrodes attached respectively to its bottom and top. If an electric field is applied across the two electrodes, the piezoelectric/electrostrictive film which lies between the two electrodes is repetitively distorted and restored, effecting vibration.

Conventionally, a piezoelectric/electrostrictive film, serving as a piezoelectric element in a micro actuator, is prepared from a ceramic powder produced by a solid phase method. This method, called an oxide method, comprises thermally treating a mixture of raw material oxide powders or their molten salts at, for example, 800–1,200° C., pulverizing and sintering them to yield ceramic powders.

Depending on the particle size of the raw material powder, the ceramic powders produced by this conventional solid phase method have different particle sizes, which are relatively large ranging from 0.2 to 2 $\mu$m, so that the solid phase method is unsuitable to produce ceramic particles as fine in size as 0.1 $\mu$m or less. In addition, this conventional method is disadvantageous in that a thermal treatment is conducted at a high temperature of 1000° C. or above.

Micro actuators are usually fabricated using a screen printing technique in which a ceramic paste is screen-printed on an infrastructure consisting of a vibrating plate and a chamber, to form fine patterns. In detail, a ceramic paste is printed on a vibrating plate with the aid of a screen and subjected to debindering, followed by sintering the ceramic at 1,000° C. or higher to form a piezoelectric/electrostrictive film with a predetermined thickness.

The screen printing method is widely used by virtue of its ability to increase the integration degree of micro actuators, but suffers from disadvantages as follows:

First, the piezoelectric/electrostrictive film is printed to a limitative low thickness. The thickness with which the conventional screen printing method can endow the piezoelectric/electrostrictive film is 5 $\mu$m at least. That is, it is difficult to form a piezoelectric/electrostrictive film at a thickness less than 5 $\mu$m with the conventional printing method.

Second, when a thick piezoelectric/electrostrictive film is formed, it is difficult to realize a high aspect ratio of patterns as well as to align the patterns to the infrastructure. The formation of thick piezoelectric/electrostrictive films is possible by controlling the emulsion film of the screen in use to a proper thickness or repetitively printing ceramic pastes twice or more times. As the printing procedure is repeated, however, newly added ceramic pastes 16 flow down over the side of formerly formed patterns as shown in FIG. 1.

Third, where a thick piezoelectric/electrostrictive film is formed by repetitively printing ceramic pastes, because a thermal treatment is conducted after each printing, the repetitive thermal history may cause the earlier formed ceramic layers to be thermally deteriorated.

Fourth, if the piezoelectric/electrostrictive film is formed in fine patterns, 30 $\mu$m or greater must be given to the width of the fine patterns and the distance therebetween. That is, it is quite difficult to obtain a pattern of piezoelectric/electrostrictive films which are finer in dimension than 30 $\mu$m by the screen printing method.

Finally, because the consequence of the screen printing is dependent on the screen pattern used and other various factors, such as ceramic paste viscosity, printing pressure, printing speed, etc, account must be taken of such factors.

SUMMARY OF THE INVENTION

Therefore, it is an object of the present invention to overcome the above problems encountered in prior arts and to provide a method for fabricating a micro actuator, whereby a piezoelectric/electrostrictive film with a desired thickness can be formed at relatively low temperatures, a high aspect ratio of piezoelectric/electrostrictive film patterns can be realized and a controlled top electrode can be obtained.

In accordance with an aspect of the present invention, there is provided a method for fabricating a micro actuator, using photolithography, which comprises the steps of: providing a metal vibrating plate; forming molds in fine patterns on the metal vibrating plate by use of a photolithographic technique in which a photoresist is coated and patterned on the metal vibrating plate; mixing a ceramic oxide powder and a ceramic sol solution, both identical or similar in composition, to prepare a ceramic paste, the ceramic oxide powder having a particle size of 5 $\mu$m or less, which is prepared from Pb and Ti-based ceramic oxide powder by a non-explosive oxidation-reduction combustion reaction at 100–500° C., the ceramic sol solution being made in water or an organic solvent; filling the ceramic paste in the molds to form a piezoelectric/electrostrictive film; conducting a thermal treatment at 100 to 300° C. to sinter the piezoelectric/electrostrictive film; and forming a top electrode on the piezoelectric/electrostrictive film.

In accordance with another aspect of the present invention, there is provided a method for fabricating a micro actuator, using photolithography, which comprises the steps of: providing a vibrating plate; forming a bottom electrode on the vibrating plate; forming molds in fine patterns on the bottom electrode by use of a photolithographic technique in which a photoresist is coated and patterned on the metal vibrating plate; mixing a ceramic oxide powder and a ceramic sol solution, both identical or similar in composition, to prepare a ceramic paste, the ceramic oxide powder having a particle size of 5 $\mu$m or less, which is prepared from Pb and Ti-based ceramic oxide powder by a non-explosive oxidation-reduction combustion reaction at 100–500° C., the ceramic sol solution being made in water or an organic solvent; filling the ceramic paste in the molds to form a piezoelectric/electrostrictive film; conducting a thermal treatment at 100 to 300° C. to sinter the piezoelectric/electrostrictive film; and forming a top electrode on the piezoelectric/electrostrictive film.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

The present invention pertains to a photolithographic technique which is useful to fabricate a micro actuator which consists of a vibrating plate and a piezoelectric/electrostrictive with two electrodes attached to its bottom and top. This photolithography will be, in detail, described in connection with the accompanying drawings.

Figure 1:
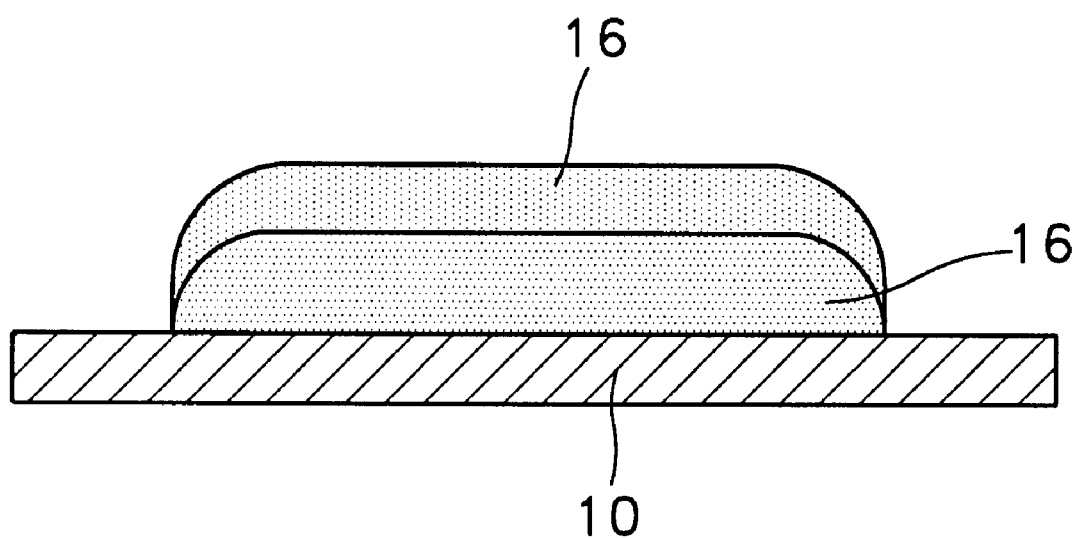
FIG. 1 is a schematic view illustrating that, when a ceramic paste is repetitively applied by use of a conventional screen printing method, the newly added ceramic pastes flow down over the side of formerly formed patterns.
Figure 2:
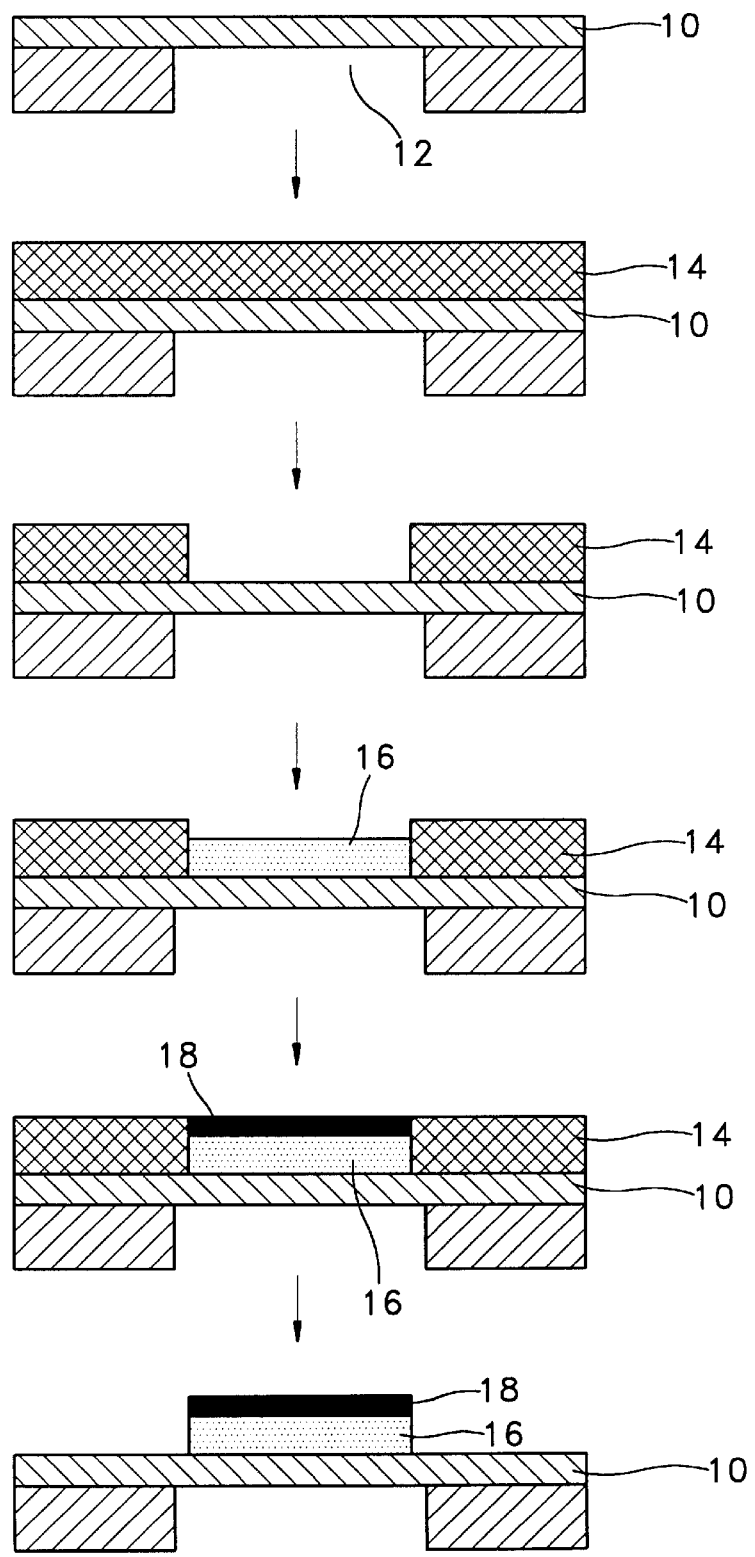
FIG. 2 is a schematic view illustrating processes for fabricating a micro actuator in which a metal vibrating plate is used as a substrate, according to an embodiment of the present invention.
Figure 3:
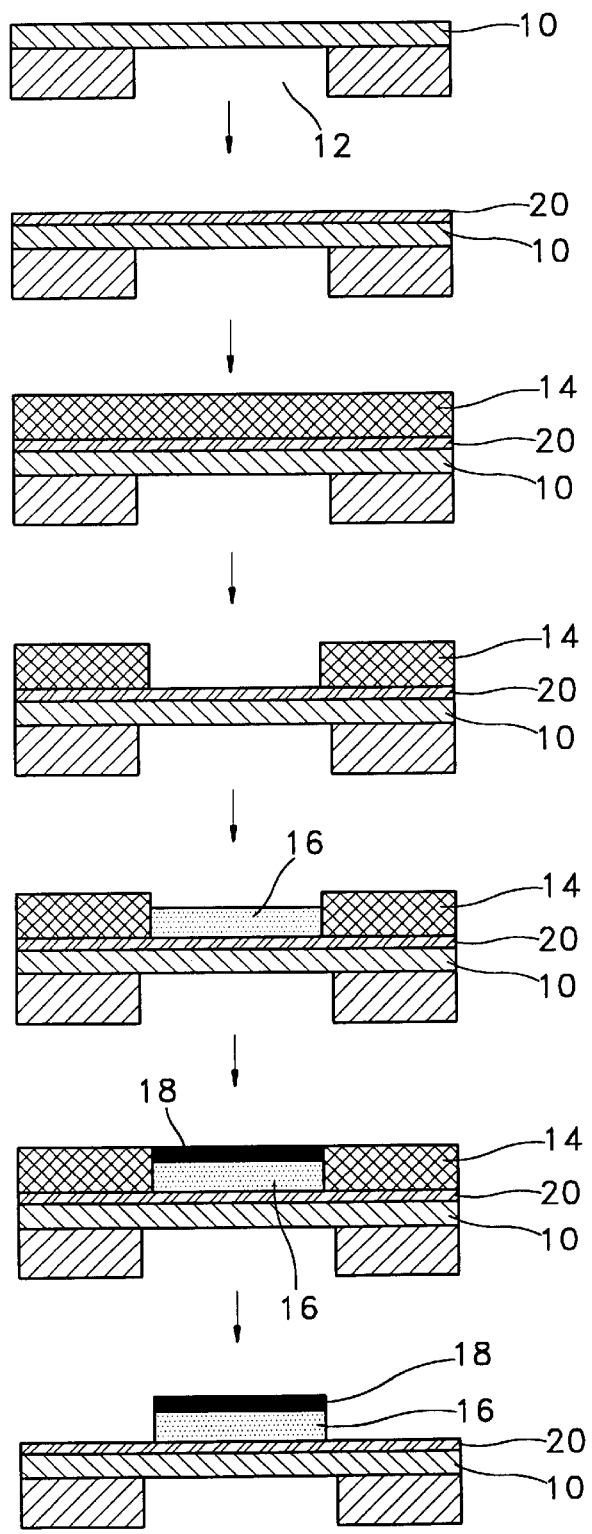
FIG. 3 is a schematic view illustrating processes for fabricating a micro actuator in which a non-electroconductive vibrating plate is used as a substrate, according to another embodiment of the present invention.

For the vibrating plate of a micro actuator, metals, silicon ceramics, metal oxides or organic compounds may be used. With reference to FIGS. 2 and 3, there are shown processes for fabricating micro actuators in which a metal and a silicon ceramic or an organic compound are employed for the vibrating plate, respectively.

Where a metal plate 10 is used as the vibrating plate as in FIG. 2, it may be made of various alloys and preferably of stainless steel (STS) or nickel. A preferred thickness of the metal plate is in a range of 3 to 20 $\mu$m. Use of a metal plate has an advantage of not requiring an additional bottom electrode because it can function as a vibrating plate and an electrode at once by virtue of its ability to conduct electricity.

As for silicon ceramic plates 10 in FIG. 3, they are preferably made of silicon, silicon dioxide ($SiO_2$), silicon carbide (SiC), or silicon nitride ($Si_3N_4$). Useful material examples for a metal oxide plate include glass or zirconia ($ZrO_2$).

In order to apply the silicon ceramics or metal oxides for the vibrating plate, slurries of their oxide powders are molded to green sheets which are then sintered. Alternatively, the slurries may be formed directly to vibrating plates which are then sintered.

In contrast to metal plates, silicon ceramic or metal oxide plates themselves are not of electroconductivity, so an additional bottom electrode is needed when the vibrating plate is made of silicon ceramic, metal oxide or an organic compound as shown in FIG. 3.

To install a bottom electrode 20 on a non-conductive vibrating plate 10, such as a silicon ceramic plate, a metal oxide plate or an organic compound plate, a paste of a conductive material, such as platinum, silver, alloy of silver and palladium, nickel or copper may be used. After being safely applied on the vibrating plate 10, the bottom electrode 20 is thermally treated at 500 to 1,400° C. and preferably at 600 to 1,200° C. As a consequence, the bottom electrode 20 is firmly attached on the vibrating plate 10.

For an organic compound plate, there is available a polymeric resin such as a polyester resin, a polyimide resin or a teflon resin. Where a resinous vibrating plate is employed in the micro actuator, it is preferably formed to a film ranging, in thickness, from 7 to 50 $\mu$m.

Like the silicon ceramic or metal oxide plate, this resinous vibrating plate demands an additional electrode 20 because of its lacking electroconductivity, as shown in FIG. 3. In this regard, the electrode 20 may be made of silver, aluminum, gold or platinum. For silver, silver paste for low temperature, commercially available, is suitable. This silver paste can be formed to the electrode by a printing technique, such as a screen printing method or a stencil printing method. On the other hand, in the case of aluminum, gold and platinum, it is formed to the electrode through sputtering, vacuum deposition or deposition. The bottom electrode 20 safely overlays the organic vibrating plate 10, followed by thermal treatment at 100 to 300° C. to combine the vibrating plate with the electrode 20, firmly.

Next, a liquid photoresist or dry film photoresist 14 is deposited or laminated on the vibrating plate 10 or the bottom electrode 20 atop the vibrating plate 10. The photoresist 14 can be formed within a thickness range of 1 to 200 $\mu$m.

Thereafter, the photoresist is patterned to give molds 14 which form a desired pattern.

For this, first, the photoresist 14 is masked in the desired pattern, aligned and exposed to UV light source. Upon light exposure, a constant exposure energy (light intensity×time) is needed. After exposure, the photoresist is developed with a developing solution. The kinds of the developing solutions are dependent on those of the photoresist used. Where the photoresist is positive, the developing solution may be selected from sodium hydroxide (NaOH), potassium hydroxide (KOH) and organic bases with water as a washing solution. On the other hand, a negative photoresist is usually developed in xylene Stoddard's solvent and washed with n-butyl acetate.

After developing the exposed photoresist, unnecessary photoresist patterns are removed to leave molds 14 which form a desired fine pattern.

If the ceramic paste used reacts with the photoresist, the patterned molds are cured by thermal treatment at 100 to 300° C.: elsewise, they may be used without thermal treatment.

Then, a piezoelectric/electrostrictive material 16 is filled to a desired thickness between the molds 14 as shown in FIGS. 2 and 3.

As the piezoelectric/electrostrictive material 16, there is used a ceramic paste which is prepared from a mixture of a ceramic oxide powder and a ceramic sol solution, both identical or similar in composition.

In order to prepare the ceramic oxide powder useful in the present invention, the ceramic components are well dissolved in a solvent to give a solution which is added with citric acid at an amount enough to cause a redox reaction with the anions of the ceramic component elements, followed by baking the resulting mixture at 100–500° C. Alternatively, the ceramic components may be uniformly dispersed in a dispersant, instead of being dissolved in the solvent. Subsequently, the dispersant is added with citric acid and baked, as above. Optionally, a thermal treatment at 700–900° C. may be further carried out to improve the crystallinity of the powder.

Raw materials containing the ceramic components may be in a form of oxides, carbides, nitrides, organic or inorganic salts, or complexes.

In the present invention, Pb/Ti-based piezoelectric/electrostrictive ceramic elements are used as the ceramic components. Preferred are those which comprise a group consisting of lead (Pb), zirconium (Zr), titanium (Ti) or a group consisting of lead (Pb), magnesium (Mg), and niobium (Nb).

As aforementioned, the ceramic components or their raw materials are dissolved in a solvent or dispersant. Thus, the solvent or dispersant must be able to dissolve and disperse the components or raw materials. It may be water or an organic solvent selected from dimethyl formamide, methoxy ethanol, acetic acid, and alcohols.

During preparation of the ceramic oxide powder, citric acid serves as a combustion aid. In conventional methods, citric acid is used not as a combustion aid, but as a complexing agent to allow a homogeneous reaction. For instance, the Pechini process takes advantage of citric acid. However, the present invention utilizes both the combustibility and complexing effect of citric acid, so as to perform a combustion reaction at a controlled rate.

To the solution or dispersion of the ceramic components is added citric acid. The amount of citric acid added must be of such a level or more, that an oxidation-reduction combustion reaction with the anions of the ceramic components can occur. The reaction rate can be controlled by the amount of citric acid added.

At a temperature of 100–500° C., the mixture of the ceramic components and citric acid is baked. As the baking temperature is higher, the crystallinity of the ceramic phase obtained is more improved. However, 100° C. is high enough to initiate the combustion reaction of citric acid while higher than 500° C., even though sufficiently inducing the reaction, is fruitless compared with conventional methods. Preferably, the baking is performed at 150–300° C. This temperature range is properly low, allowing the crystallinity of the ceramic phase to be formed certainly.

During the combustion reaction, the citric acid is removed and a ceramic oxide is formed without scattering by the reaction heat of citric acid. In addition, the ingredients which are not the ceramic components are removed by the combustion reaction over a long period of time, so that there is formed a pure ceramic oxide powder, free of impurities.

The ceramic oxide powder thus prepared is 5 μm or less in particle size and preferably 0.5 μm or less with a uniform particle size distribution. Its primary particle is in the form of an independent body or a soft aggregate. In addition, the primary particles are of a completely burned ceramic phase, so that their weight is not reduced by a further thermal treatment. Furthermore, since the reactivity of the surface of the powder is superb, it can be molded by simply conducting a thermal treatment at a low temperature. Therefore, the powder of the invention gives a high degree of freedom to the vibrating plate of the resulting device and makes it possible to use a printing or coating method.

With the aim of increasing the crystallinity of the ceramic oxide powder prepared, a thermal treatment at 700–900° C. may be further conducted.

Together with the ceramic sol solution prepared above, the ceramic oxide powder is used to produce a ceramic paste. In this regard, the ceramic oxide powder is preferably made of PZT, PMN or their solid solution (PZT-PMN) oxide composite. This ceramic oxide powder may further comprise one selected from the group consisting of nickel (Ni), lanthanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), manganese (Mn) and combinations thereof.

The ceramic sol solution useful for the piezoelectric/electrostrictive film employs water or an organic solvent as a base in which ceramic components are dissolved. The organic solvent is selected preferably from the group consisting of acetic acid, dimethyl formamide, methoxyethanol, and alcohols. Preferred is a ceramic sol solution comprising lead, zirconium and titanium at a concentration of 0.1–5 M.

When preparing a mixture of the ceramic oxide powder and the ceramic sol solution, it is preferable that the ceramic sol solution is added at an amount of 10 to 200 weight parts based on 100 weight parts of the ceramic oxide. For example, if the amount of the ceramic sol solution is over 200 weight parts, the mixture is too low in viscosity. On the other hand, if the ceramic sol solution is added at an amount less than 10 weight parts, the resulting mixture is too viscous.

If the ceramic oxide powder is mixed with the ceramic sol solution, the ceramic sol solution of a liquid phase is uniformly coated on the surface of the ceramic oxide powder of a solid phase, effectively filling the voids between the particles of the powder to connect one particle to another. In the resulting powder-sol mixture, the particles of the ceramic oxide powder, which have ceramic characteristics, are surrounded by the ceramic sol solution whose components are the same as or similar to those of the powder, becoming fluid. Serving as a reaction medium on the surface of the ceramic oxide powder, the ceramic sol improves the reactivity of the surface.

As far as the organic component in the sol is concerned, when the powder-sol mixture is brought into contact with another organic material, it secures stability at the contact interface, enabling the mixture to be of dispersibility and homogeneity.

At a low temperature, the sol can be pyrolyzed and because the residue has components the same as or similar to those of the ceramic oxide powder, a ceramic system in which the particles are sufficiently connected with each other can be obtained at a low temperature.

In order to secure the stability and fluidity necessary to mold the powder-sol mixture, an organic solvent may be added to adjust the physical properties of the mixture. It may be selected from various solvents, but preferably from glycols and alcohols because they are of some viscosity with low volatility at room temperature. Its amount preferably ranges from 1 to 100 weight parts based on 100 weight parts of the ceramic oxide powder. For example, if the organic solvent for adjusting the mixture is added at an amount less than 1 weight part, no effects can be obtained from the organic solvent. On the other hand, if the added amount of the organic solvent is over 100 weight parts, the mixture cannot maintain a viscosity, but becomes too diluted to be molded. More preferably, the organic solvent for adjusting the physical properties of the sol-gel mixture is added at an amount of 10–40 weight parts based on 100 weight parts of the ceramic oxide powder. Within this range, the organic solvent allows the viscosity of the mixture to be properly maintained as well as accomplishes the effect of adjusting the physical properties.

In addition, in order to further improve the dispersibility and homogeneity of the mixture of the ceramic oxide powder and the ceramic sol solution added with the organic solution, a small amount of an organic material may be used. Suitable are long chain alcohols or polar organic solvents. Preferable examples include pentanol and hexanol for the long chain alcohol, and acetyl acetone and methoxy ethane for the polar organic solvent. The organic material preferably ranges, in quantity, from 1 to 100 weight parts based on 100 weight parts of the ceramic oxide powder. For example, if the organic solvent for adjusting the mixture is added at an amount less than 1 weight part, no effects can be obtained from the organic material. On the other hand, if the added amount of the organic solvent is over 100 weight parts, the mixture cannot maintain a viscosity, but becomes too diluted to be molded. More preferably, the organic material is added at an amount of 10–40 weight parts based on 100 weight parts of the ceramic oxide powder. Within this range, the organic material allows the viscosity of the mixture to be properly maintained as well as accomplishes the effect of adjusting the physical properties.

The piezoelectric/electrostrictive film is not obtained without conducting a thermal treatment at 100 to 300° C. for the ceramic paste filled between the molds. While this thermal treatment removes the solvent, the ceramic sol serves as a reaction medium at the surface of the oxide particles to induce the linkage between the ceramic oxide particles.

As illustrated, sufficient reactions are elicited by the thermal treatment at such a low temperature, from 100 to 300° C. This is attributed to the fact that the same effect as sintering may be accomplished by the reciprocal reaction in which the water on the surface of the ceramic oxide powder induces the hydrolysis of the ceramic sol solution and the ceramic components of the ceramic sol solution, separated as a consequence of the hydrolysis, combine with the ceramic oxide powder. The organic matters added are removed in this thermal treatment, as well.

Possible as it is, a thermal treatment at higher than 300° C. is disadvantageous because it may do damage to the patterned photoresist 14.

Next, returning now to FIGS. 2 and 3, a top electrode 18 is safely installed on the sintered piezoelectric/electrostrictive film.

The top electrode 18 may be made of silver, aluminum, gold or platinum. For silver, silver paste for low temperature, commercially available, is suitable. This silver paste can be formed to the electrode by a printing technique or a blading technique. On the other hand, in the case of aluminum, gold and platinum, it is formed to the electrode through sputtering, vacuum evaporation or deposition.

A solid bond between the piezoelectric/electrostrictive and the top electrode can be attained by a thermal treatment at as low as 100 to 300° C. If the thermal treatment is conducted at higher than 300° C., the photoresist, left as the molds, is apt to be destroyed.

Where the top electrode is made of aluminum or gold, this enjoys an advantage in that the top electrode can be used immediately without an additional thermal treatment.

The photoresist can be adjusted in thickness to a fine extent within a range of 1 to 200 $\mu$m, so the top electrode and the piezoelectric/electrostrictive film are also free in selecting their thicknesses within the range. Preferably, the piezoelectric/electrostrictive has a thickness of 1 to 100 $\mu$m and more preferably 5 to 30 $\mu$m.

Following the formation of the top electrode, the photoresist may be removed or left as it is, according to necessity. For removal of the photoresist layer, a thermal treatment at 500° C. or higher, dissolution with a solvent, or ultrasonification subsequent to dissolution in a solvent is effective. The solvent for dissolving the photoresist layer is exemplified by acetones, alcohols, and diluted hydrochloric acid or sulfuric acid.

In conventional techniques, the photoresist is obliged to be burned out by a thermal treatment at a high temperature. In contrast, the photoresist may be removed or left according to necessity in the present invention. Particularly, a metal plate could be distorted or denatured by a thermal treatment at high temperatures. Thus, in the case of using a metal plate as a substrate, a thermal treatment at lower than 300° C. is conducted with the photoresist remaining undestroyed.

In addition, the thermal treatment at 100 to 300° C. can be advantageously applied for where the organic matters of the ceramic paste react with the photoresist: thermally curing has an effect of minimizing the reaction. Further, there can be used not only the ceramic paste, but also a slurry-type ceramic powder-sol-gel composite, which is impossible to sinter in conventional techniques.

Protecting the piezoelectric/electrostrictive films from external damage, such as scratching, the molds surround them. Because the molds themselves are insulators, they save a process of forming an additional insulating layer against the bottom electrode or the vibrating plate. That is, the present invention is relatively simple.

Furthermore, as illustrated, the present invention shows the advantages of attaining high aspect ratios of fine patterns and improving the bonding properties between the piezoelectric/electrostrictive film and the infrastructure.

A better understanding of the present invention may be obtained in light of the following examples which are set forth to illustrate, but are not to be construed to limit the present invention.

EXAMPLE I

In an automatic mortar were ground 5 g of a fine PZT powder with an average particle size of 50 nm, in admixture with 35 ml of ethanol. Together with this mixture, 0.8 g of 2-methoxyethanol, 0.2 g of acetyl acetone and 3.0 g of PZT sol were mixed for 1 hour to prepare a ceramic paste.

In fine patterns of a photoresist film formed on a nickel vibrating plate, the ceramic paste was filled, and dried at room temperature for 5 hours, followed by conducting a thermal treatment at 130° C. for 2 hours to produce a piezoelectric/electrostrictive film.

After being applied on the piezoelectric/electrostrictive film by use of a blading method, a silver paste was thermally treated at 200° C. to fabricate a micro actuator.

EXAMPLE II

In an automatic mortar were ground 5 g of a fine PZT/PMN powder with an average particle size of 50 nm, in admixture with 35 ml of ethanol. Together with this mixture, 0.6 g of 1-pentanol, 1.4 g of trimethyleneglycol and 6 g of PZT sol were mixed for 1 hour to prepare a ceramic paste.

In fine patterns of a photoresist film formed on an STS vibrating plate, the ceramic paste was filled, and dried at room temperature for 5 hours, followed by conducting thermal treatment at 130° C. for 2 hours and 300° C. for 1 hour to produce a piezoelectric/electrostrictive film.

On the piezoelectric/electrostrictive film was formed an electrode by sputtering platinum, after which a thermal treatment was conducted at 150° C. to fabricate a micro actuator.

EXAMPLE III 5 g of a fine PZT/PMN powder with an average particle size of 50 nm, in admixture with 0.3 g of 1-pentanol, 0.6 g of trimethyleneglycol and 1.5 g of PZT sol were ground for 1.5 hours in an automatic mortar to prepare a ceramic paste.

In fine patterns of a photoresist film formed on a polyimide resin vibrating plate, the ceramic paste was filled, and dried at room temperature for 5 hours, followed by conducting thermal treatment at 130° C. for 2 hours and 300° C. for 1 hour to produce a piezoelectric/electrostrictive film.

On the piezoelectric/electrostrictive film was formed an electrode by sputtering platinum, after which a thermal treatment was conducted at 150° C. to fabricate a micro actuator.

EXAMPLE IV 5 g of a PZT/PMN powder were ground for 30 min in an automatic mortar and then, further for 1 hour together with 2 g of PZT sol, 0.7 g of trimethyleneglycol, and 0.5 g of 2-methoxyethanol.

The ceramic paste thus obtained was homogenized by passing through a 3-roll mill equipped with aluminum rolls and filled in an STS substrate on which a photoresist film was patterned, followed by leveling the ceramic paste at room temperature to allow a ceramic thick film. Then, this ceramic thick film was dried and subjected to thermal treatment at 250° C. for 1 hour.

On this film was installed an electrode by vacuum depositing gold, thus fabricating a micro actuator.

EXAMPLE V

In an automatic mortar, 5 g of a PZT/PMN powder was mixed with 0.7 g of trimethyleneglycol and 0.5 g of 1-pentanol for 5 hours and then, further for 30 min, together with 2 g of PZT sol.

The paste thus obtained was filled in a nickel substrate on which a photoresist film was patterned, followed by leveling the ceramic paste at room temperature to allow a ceramic thick film. Thereafter, this thick film was dried at 70° C. and baked at 250° C. for 1 hour.

On this film was installed an electrode by vacuum depositing gold, thus fabricating a micro actuator.

EXAMPLE VI 5 g of a PZT/PMN powder was added with 2.5 g of PZT acetic acid sol and stirred for 30 min. After vaporizing the acetic acid completely, a complex of powder and PZT (52/48) gel was obtained. This complex was mixed with 0.8 g of trimethyleneglycol and 0.4 g of 1-pentanol for 1 hour in an automatic mortar.

The paste thus prepared was characteristic of being not changed in viscosity with time because it was deprived of acetic acid, highly volatile. This paste was filled in a nickel substrate on which a photoresist film was patterned, dried at 130° C. and baked at 200° C. for 2 hours to form a ceramic film.

Aluminum was subjected to vacuum deposition to form an electrode on the ceramic film, thus fabricating a micro actuator.

The present invention has been described in an illustrative manner, and it is to be understood the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method for fabricating a micro actuator, using photolithography, which comprises the steps of:

providing a metal vibrating plate;

forming molds in fine patterns on the metal vibrating plate by use of a photolithographic technique in which a photoresist is coated and patterned on the metal vibrating plate;

mixing a ceramic oxide powder and a ceramic sol solution, both identical or similar in composition, to prepare a ceramic paste, the ceramic oxide powder being produced by a method comprising the steps of:

dissolving or uniformly dispersing a raw material of constituent ceramic elements in a solvent or dispersion medium thereby preparing a solution or dispersed mixture containing said constituent ceramic elements;

adding citric acid in said solution or dispersed mixture, in which said constituent ceramic elements are dissolved or dispersed, at least in an amount required to generate an oxidative-reductive combustion reaction with anions of said constituent ceramic elements, thereby preparing a mixed solution; and thermally treating said mixed solution at a temperature of approximately 100 to 500°, thereby evaporating said solvent or dispersion medium while causing said citric acid to act as a reductive combustion aid after said evaporation of said solvent or dispersed medium, thereby generating a non-explosive oxidative-reductive combustion reaction with said anions of said constituent ceramic elements, so that said citric acid is removed as said combustion reaction proceeds, and ceramic oxide is produced without any scattering by virtue of heat generated during said combustion reaction, whereby ceramic oxide powder having a grain size of 5 $\mu$m or less and exhibiting a uniform grain size distribution is finally produced;

the ceramic sol solution being made in water or an organic solvent;

filling the ceramic paste in the molds to form a piezoelectric/electrostrictive film;

conducting a thermal treatment at 100 to 300° C. to sinter the piezoelectric/electrostrictive film; and forming a top electrode on the piezoelectric/electrostrictive film.

2. A method in claim 1, further comprising the step of thermally treating the molds at 100 to 300° C., subsequent to the mold forming step.

3. A method in claim 1, further comprising the step of thermally treating the molds at 100 to 300° C., subsequent to the top electrode forming step.

4. A method in claim 1, further comprising the step of removing the molds, subsequent to the top electrode forming step.

5. A method in claim 1, wherein the metal vibrating plate is made of stainless steel or nickel.

6. A method in claim 1, wherein the photoresist ranges, in thickness, from 1 to 200 $\mu$m.

7. A method in claim 1, wherein the ceramic oxide powder has a particle size of 0.5 $\mu$m or less.

8. A method in claim 1, wherein the ceramic oxide powder is selected from the group consisting of a PZT oxide, a PMN oxide and a solid solution composite oxide of PZT and PMN.

9. A method in claim 8, wherein the ceramic oxide powder further comprises at least one selected from the group consisting of nickel (Ni), lanthanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), manganese (Mn) and the mixtures thereof.

10. A method in claim 1, wherein the piezoelectric/electrostrictive film ranges, in thickness, from 1 to 100 $\mu$m.

11. A method in claim 10, wherein said piezoelectric/electrostrictive film ranges, in thickness, from 5 to 30 $\mu$m.

12. A method in claim 1, wherein the top electrode is made of one selected from the group consisting of silver (Ag), aluminum (Al), gold (Au) and platinum (Pt).

13. A method for fabricating a micro actuator, using photolithography, which comprises the steps of:
  providing a vibrating plate;
  forming a bottom electrode on the vibrating plate;
  forming molds in fine patterns on the bottom electrode by use of a photolithographic technique in which a photoresist is coated and patterned on the
  mixing a ceramic oxide powder and a ceramic sol solution, both identical or similar in composition, to prepare a ceramic paste, the ceramic oxide powder being produced by a method comprising the steps of:
    dissolving or uniformly dispersing a raw material of constituent ceramic elements in a solvent or dispersion medium thereby preparing a solution or dispersed mixture containing said constituent ceramic elements;
    adding citric acid in said solution or dispersed mixture, in which said constituent ceramic elements are dissolved or dispersed, at least in an amount required to generate an oxidative-reductive combustion reaction with anions of said constituent ceramic elements, thereby preparing a mixed solution; and
    thermally treating said mixed solution at a temperature of approximately 100 to 500°, thereby evaporating said solvent or dispersion medium while causing said citric acid to act as a reductive combustion aid after said evaporation of said solvent or dispersed medium, thereby generating a non-explosive oxidative-reductive combustion reaction with said anions of said constituent ceramic elements, so that said citric acid is removed as said combustion reaction proceeds, and ceramic oxide is produced without any scattering by virtue of heat generated during said combustion reaction, whereby ceramic oxide powder having a grain size of 5 $\mu$m or less and exhibiting a uniform grain size distribution is finally produced;
  the ceramic sol solution being made in water or an organic solvent;
  filling the ceramic paste in the molds to form a piezoelectric/electrostrictive film;
  conducting a thermal treatment at 100 to 300° C. to sinter the piezoelectric/electrostrictive film; and
  forming a top electrode on the piezoelectric/electrostrictive film.

14. A method in claim 13, further comprising the step of thermally treating the molds at 100 to 300° C., subsequent to the mold forming step.

15. A method in claim 13, further comprising the step of thermally treating the molds at 100 to 300° C., subsequent to the top electrode forming step.

16. A method in claim 13, further comprising the step of removing the molds, subsequent to the top electrode forming step.

17. A method in claim 16, wherein the vibrating plate is a ceramic vibrating plate.

18. A method in claim 17, wherein the ceramic vibrating plate is made of one selected from the group consisting of aluminum oxide ($Al_2O_3$), zirconia ($ZrO_2$), silicon carbide (SiC), silicon nitride ($Si_3N_4$), silicon dioxide ($SiO_2$) and glass.

19. A method in claim 17, wherein the bottom electrode is made of one selected from the group consisting of platinum (Pt), silver (Ag), silver/palladium (Ag/Pd) alloy, nickel, and copper (Cu).

20. A method in claim 17, wherein the ceramic vibrating plate is subjected to thermal treatment at 500 to 1,400° C., subsequent to the bottom electrode forming step.

21. A method in claim 13, wherein the vibrating plate is a resinous organic polymer vibrating plate.

22. A method in claim 21, wherein the resineous organic polymer vibrating plate is made of one selected from the group consisting of polyesters, polyimides, and teflon.

23. A method in claim 22, wherein the bottom electrode is made of one selected from the group consisting of silver (Ag), aluminum (Al), gold (Au) and platinum (Pt).

24. A method in claim 22, wherein the resineous organic polymer vibrating plate is subjected to thermal treatment at 100 to 300° C., subsequent to the bottom electrode forming step.

25. A method in claim 13, wherein the top electrode is made of one selected from the group consisting of silver (Ag), aluminum (Al), gold (Au) and platinum (Pt).

26. A method in claim 13, further comprising the step of thermally treating the molds at 100 to 300° C., subsequent to the top electrode forming step.

27. A method in claim 13, wherein the ceramic oxide powder has a particle size of 0.5 $\mu$m or less.

28. A method in claim 13, wherein the ceramic oxide powder is selected from the group consisting of a PZT oxide, a PMN oxide and a solid solution composite oxide of PZT and PMN.

29. A method in claim 28, wherein the ceramic oxide powder further comprises at least one selected from the group consisting of nickel (Ni), lanthanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), manganese (Mn) and the mixtures thereof.

30. A method in claim 13, wherein the piezoelectric/electrostrictive film ranges, in thickness, from 1 to 100 $\mu$m.

31. A method in claim 30, wherein said piezoelectric/electrostrictive film ranges, in thickness, from 5 to 30 $\mu$m.

* * * * *